United States Patent
Lakhera et al.

(10) Patent No.: US 10,431,534 B2
(45) Date of Patent: Oct. 1, 2019

(54) PACKAGE WITH SUPPORT STRUCTURE

(71) Applicant: NXP USA, Inc., Austin, TX (US)

(72) Inventors: Nishant Lakhera, Austin, TX (US); Gilles Montoriol, Midi-Pyrenees (FR); Trung Duong, Austin, TX (US); Akhilesh Kumar Singh, Austin, TX (US); Navas Khan Oratti Kalandar, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/864,348

(22) Filed: Jan. 8, 2018

(65) Prior Publication Data
US 2019/0181079 A1    Jun. 13, 2019

(30) Foreign Application Priority Data
Dec. 11, 2017  (EP) .................... 17306739

(51) Int. Cl.
| H01L 21/48 | (2006.01) |
| H01L 23/498 | (2006.01) |
| H01L 23/00 | (2006.01) |
| H01L 23/48 | (2006.01) |
| H01L 25/065 | (2006.01) |
| H01L 25/00 | (2006.01) |
| H01L 23/31 | (2006.01) |
| H01L 23/538 | (2006.01) |

(52) U.S. Cl.
CPC ...... *H01L 23/49816* (2013.01); *H01L 21/486* (2013.01); *H01L 23/3114* (2013.01); *H01L 23/481* (2013.01); *H01L 23/49838* (2013.01); *H01L 23/5386* (2013.01); *H01L 24/05* (2013.01); *H01L 24/16* (2013.01); *H01L 25/0652* (2013.01); *H01L 25/50* (2013.01); *H01L 2224/056* (2013.01); *H01L 2224/73253* (2013.01); *H01L 2924/14* (2013.01)

(58) Field of Classification Search
CPC combination set(s) only.
See application file for complete search history.

(56) References Cited

U.S. PATENT DOCUMENTS

| 8,283,768 B2 | 10/2012 | Kang et al. |
| 8,912,648 B2 | 12/2014 | Lin et al. |
| 2008/0150164 A1* | 6/2008 | Chia ................ H01L 23/49833 257/783 |
| 2011/0233756 A1 | 9/2011 | Khandekar et al. |

* cited by examiner

Primary Examiner — Fernando L Toledo
Assistant Examiner — Valerie N Newton
(74) Attorney, Agent, or Firm — Senaida B. San Miguel

(57) ABSTRACT

Embodiments are provided herein for a packaged semiconductor device and method of fabricating, the device including: a semiconductor die; a redistribution layer (RDL) structure on an active side of the semiconductor die, the RDL structure including a plurality of contact pads on an outer surface of the RDL structure; a plurality of external connections attached to the plurality of contact pads; and a support structure including an attachment portion and two or more standing members extending from an inner surface of the attachment portion, wherein a back side of the package body is attached to the inner surface of the attachment portion.

20 Claims, 5 Drawing Sheets

PACKAGE WITH SUPPORT STRUCTURE

BACKGROUND

Field

This disclosure relates generally to semiconductor packages, and more specifically, to semiconductor packages having a support structure for mechanical support.

Related Art

Semiconductor packages may be attached to printed circuit boards (PCBs) by a number of solder joints, such as solder balls arranged in a ball grid array (BGA). Typically, the coefficient of thermal expansion (CTE) of a package is different than the CTE of a PCB, where this difference creates mechanical stress on the solder joints attaching the package to the PCB. To address this issue, underfill material is usually placed around the solder joints between the package and the PCB to strengthen the attachment of the package to the PCB. The underfill material protects the solder joints by distributing various mechanical stresses away from the solder joints, such as those arising from thermal expansion, as well as from mechanical shocks or vibration. The underfill material generally minimizes breaks in the solder joints, improving the robustness of the solder joints.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

While underfill material is typically used to improve the robustness of solder joints between a package and a printed circuit board (PCB), such underfill material is a dielectric or insulating material that may cause serious performance degradation of packages in radio frequency (RF) applications, such as radar or wireless communication. For example, a solder joint (such as a solder ball or solder bump) that conveys an RF signal between the package and the PCB may experience signal degradation when the solder joint is surrounded by a dielectric material. One approach to address RF signal degradation is to avoid the use of underfill altogether and instead use an edge bond material around the edge of the package to strengthen the attachment of the package to the PCB. However, the edge bond material may similarly surround (or at least partially surround) solder joints located near the edge of the package. Since RF connections are often located around the edge of the package, the use of edge bond material may still result in RF signal degradation.

The present disclosure provides a support structure to strengthen mechanical attachment of the package to the PCB, which avoids the use of underfill material or edge bond material while achieving robust board level reliability. The support structure mechanically supports the package (e.g., supports the weight of the package) and distributes mechanical stress away from external connections between the package and the PCB, which may be solder joints, such as solder balls or solder bumps, or other conductive metal joints, such as copper pillars or copper studs. The support structure may also include a radio frequency (RF) absorber material that is adjacent to the package in order to improve RF signal isolation within the package.

Example Embodiments

Figure 1A:
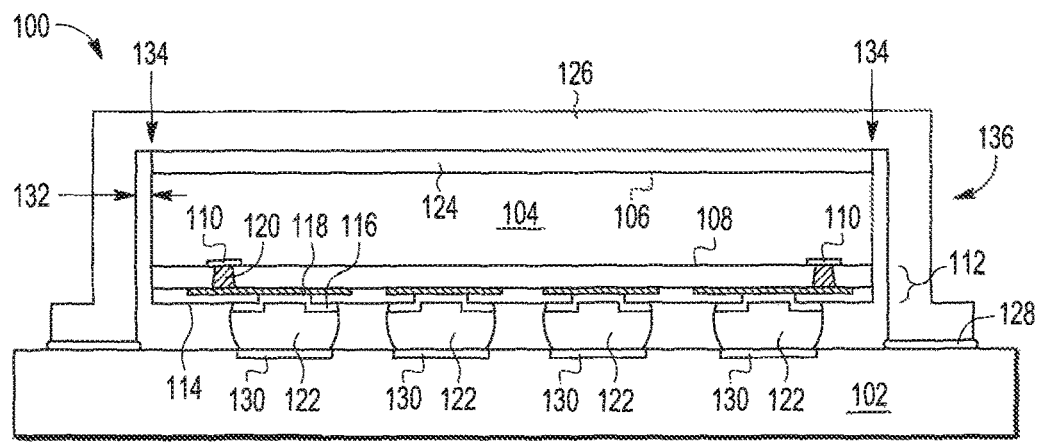
FIGS. 1A, 1B, and 1C are block diagrams depicting example semiconductor packages having a support structure according to some embodiments of the present disclosure.

FIG. 1A shows a cross-sectional view of an example semiconductor package 100 (also referred to as a packaged semiconductor device 100 or simply as a package 100) having a support structure 126 according to the present disclosure. In the embodiment shown, package 100 is a chip scale packaging (CSP) package attached to a printed circuit board (PCB) 102. In other embodiments, package 100 may be attached to another type of suitable surface, such as a substrate, an interposer, or another package. CSP packages generally have a package footprint equal to or less than 1.2 times the die footprint, and may have a pitch equal or less than 0.8 mm. While the following figures described herein show a wafer level CSP package, the teachings of the present disclosure may also be applicable to other package types, such as a fan out wafer level packaging (FOWLP) package, or other package types that utilize a ball grid array (BGA) or otherwise configured to be attached by joints (e.g., solder balls, solder bumps such as C4 bumps, copper pillars, copper studs, or other conductive metal joints) to a suitable surface (e.g., a PCB, a substrate, an interposer, or another package). An example wafer level chip scale packaging (WLCSP) fabrication process for a package that includes formation of an isolation structure is discussed below beginning with FIG. 3A.

Package 100 includes a package body 136, which in turn includes a semiconductor die 104 having a back side 106 of silicon (e.g., bulk silicon) and an opposite front side or active side 108 that includes active circuitry and a plurality of bond pads 110. The active circuitry may include circuitry configured to transmit or receive radio frequency (RF) signals (e.g., an RF transmitter, an RF receiver, or both in an RF transceiver). RF signals have a frequency that generally falls within a range of 20 kHz to 300 GHz. Non-RF signals have a frequency that generally falls below 20 kHz, and may also include power supply signals. Each bond pad 110 is connected to a signal line of the active circuitry that may carry either an RF signal or may carry a non-RF signal. In some embodiments, semiconductor die 104 may be a flip chip die, or a die that may be attached to a suitable surface in a face-down orientation (e.g., active side facing the suitable surface).

Package body 136 also has an outer perimeter or footprint 134 at the lateral edges of the package body 136, where the lateral edges of the package body 136 are perpendicular to the active side 108 (as well as the back side 106) of the die 104. In the embodiment shown, back side 106 of the die 104 forms the back side of the package body 136, although the back side of the package body 136 may be formed by a layer of molding compound over the back side 106 of the die 104 (e.g., in a BGA or FOWLP package). Also in the embodiment shown, lateral edges of the die 104 form the lateral edges of the package body 136, although the lateral edges of the package body 136 may be formed by a layer of molding compound around the lateral edges of the die 104 (e.g., in a BGA or FOWLP package).

Semiconductor die 104 may be singulated from a semiconductor wafer (shown in FIG. 4A), which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, MEMS (microelectromechanical systems) device, a standalone discrete device such as a resistor, inductor, capacitor, diode, power transistor, and the like.

A redistribution layer (RDL) structure 112 is formed over the active side 108 of the die 104. RDL structure 112 includes a number of patterned dielectric layers and metal layers, which form routing or connection paths through the RDL structure 112. The connection paths provide electrical connections between the plurality of bond pads 110 on the die 104 and a plurality of external contact pads 116 at an outermost surface 114 of the RDL structure 112. Each connection path may include a metal filled via 120 that makes electrical contact with a respective bond pad 110, and a metal trace 118 that makes electrical contact with the metal filled via 120 at one end and makes electrical contact with a respective contact pad 116 at the other end. While the figures show simple metal traces (e.g., traces formed from a single metal layer), the patterned dielectric layers and metal layers may be repeated to create complex routing or connection paths through the RDL structure 112.

The RDL structure 112 may be formed using a sequence of process steps applied to the active side 108 of the die 104, including but not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like. Example process steps to fabricate the RDL structure are discussed below in connection with 3A.

A plurality of external connections are respectively attached to the external contact pads 116. In the embodiment shown, the external connections are solder balls 122, where one or more solder balls 122 are electrically connected to signal lines that carry RF signals, while some solder balls 122 are electrically connected to signal lines that carry non-RF signals. Each external connection is electrically connected through contact pad 116, metal trace 118, metal filled via 120, and bond pad 110 to a respective signal line. In other embodiments, the external connections may be implemented as copper pillars or copper studs, or other suitable conductive metal joints. The plurality of external connections are also attached to landing pads 130 on the PCB 102. The external connections are both electrically connected to the PCB and provide mechanical attachment of the package 100 to the PCB 102. PCB 102 includes electrically conductive features on a non-conductive substrate. PCB 102 may be a flexible type PCB using polyimide or a rigid type PCB using FR4 or BT resin.

The mechanical attachment of the package 100 to the PCB 102 is strengthened using support structure 126. The support structure 126 is attached to a back side of the package body 136 and extends down to the PCB 102. When attached to the PCB 102, the support structure 126 load-shares mechanical stress experienced by the package 100, distributing the mechanical stress away from the external connections. This provides for robust solder joint reliability without the need for any additional adhesive material, such as underfill material, edge bond material, mold compound material, or other similar material. In the embodiment shown, the support structure 126 has a top portion and two or more vertical portions, illustrative examples of which are shown in FIG. 2A-2F, discussed below. In some embodiments, the support structure 126 is formed from metal or composite metal, examples of which include nickel, copper, aluminum, or other suitable metal or alloy composed of one or more suitable metals. In other embodiments, the support structure 126 is formed from dielectric material, which is an insulating material having sufficient load bearing capability for supporting the package 100. The dielectric material may also have dielectric properties that may help improve signal isolation in the package 100 (e.g., high dielectric constant).

The back side of the package body 136 is attached to an inner surface of the top portion of the support structure 126 using an adhesive material 124. In some embodiments, adhesive material 124 may be a pressure-sensitive adhesive material, which bonds to the back side of the package body 136 and to the inner surface of the support structure 126 when pressure is applied. Examples of pressure-sensitive adhesive material may include but are not limited to elastomers, acrylics, epoxy, resin, and the like. In some embodiments, the adhesive material 124 may be in the form of a dry film or double-sided tape that adheres to both the package body 136 and the inner surface of the support structure 126 when pressure is applied.

In other embodiments, adhesive material 124 may also include a radio frequency (RF) absorber material that is configured to absorb RF signals and improve RF isolation within package 100. In such embodiments, a pressure-sensitive adhesive material is applied on both sides of a layer of the RF absorber material to attach to the back side of the package body 136 and to the inner surface of the support structure 126. The RF absorber material is a high permittivity or high permeability material that absorbs energy. In some embodiments, the thickness of the RF absorber material is greater than 50 microns. Examples of RF absorber material include but are not limited to a magnetic absorber material having high magnetic loss, a dielectric absorber material having a high dielectric constant, and the like. In some embodiments, the RF absorber material has a high loss tangent at millimeter wave (mmWave) frequencies, such as frequencies in the range of 76 to 100 GHz. In some embodiments, the RF absorber material may be a foam type of material that may help isolate the package body 136 from any stress experienced by the support structure 124. In some embodiments, the RF absorber material may be thermally conductive to assist in heat dissipation from the package body 136 or from the back side 106 of the die 104, which may be beneficial in metal embodiments of the support structure 126 that may dissipate heat. In some embodiments, the RF absorber material is stable at high temperatures in the range of 150 to 175 degrees Celsius.

Also in the embodiment shown, the support structure 126 has a lateral gap 132 between the vertical portions of the support structure 126 and the lateral sides of the package body 136. The lateral gap 132 provides a degree of tolerance for any variations that may occur when placing the package body 136 within the support structure 126.

Figure 1B:
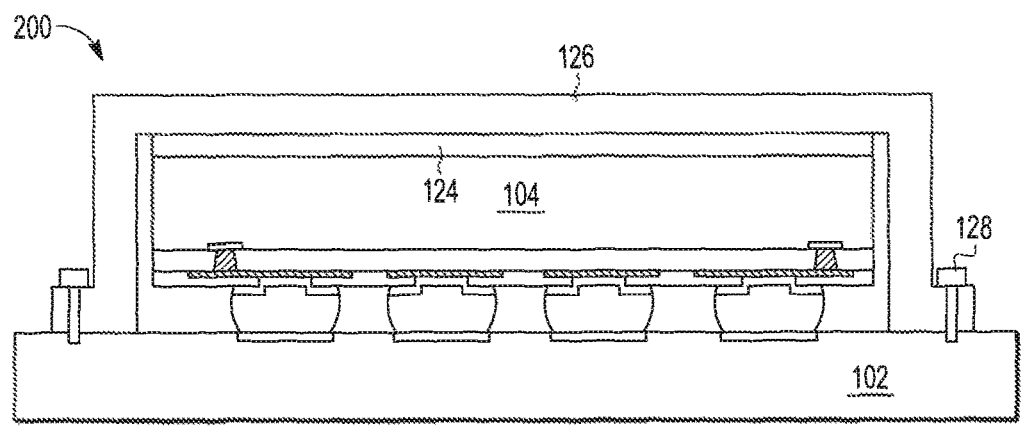
Figure 1C:
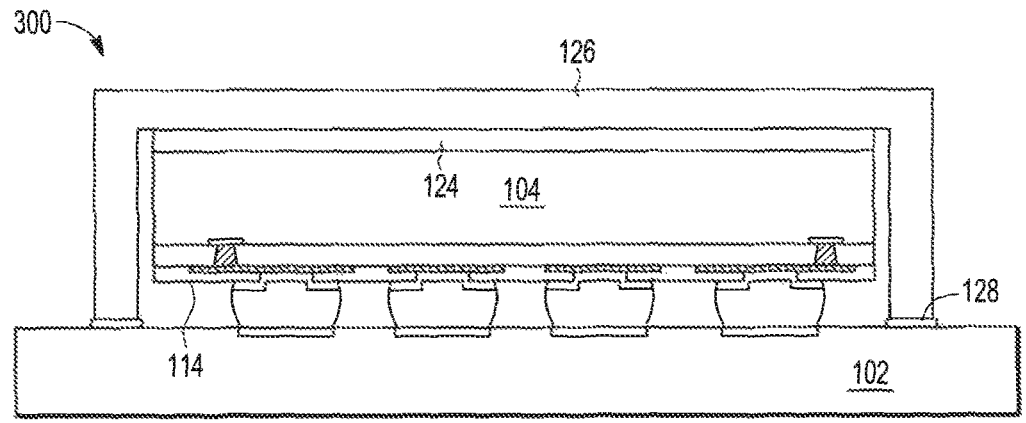

The vertical portions of the support structure 126 are attached to the PCB 102 with an attachment mechanism 128. In the embodiment shown, each vertical portion has a "foot" or extended bottom surface that is attached to the top surface of the PCB 102, where the attachment mechanism 128 is solder attach material. Solder attach material may be in the form of solder paste, solder film, and the like. It is noted that the vertical portion of the support structure 126 need not be placed on a landing pad of the PCB 102. FIG. 1B shows another embodiment of the attachment mechanism 128 of support structure 126, where each foot of the vertical portions is attached to the PCB 102 with a rivet 128. FIG. 10 shows another embodiment of the support structure 126 without feet on the vertical portions, where each bottom surface of the vertical portions is attached to the top surface of the PCB 102 with solder attach material 128.

Figure 2A:
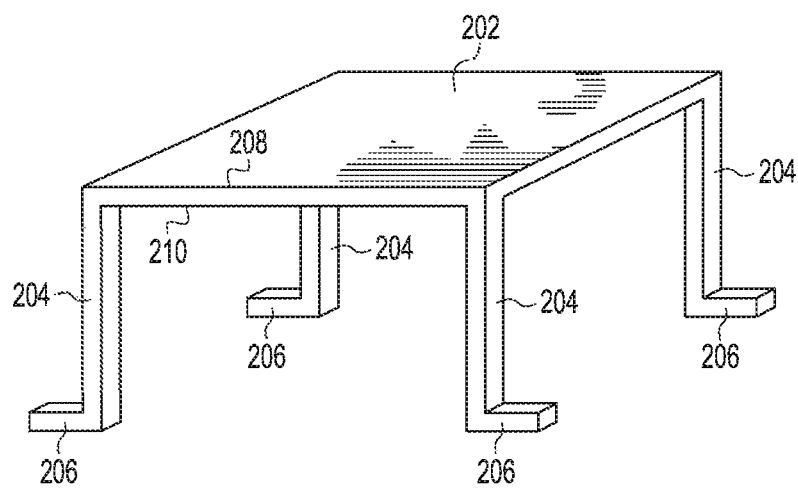
FIGS. 2A, 2B, 2C, 2D, 2E, and 2F are block diagrams depicting example support structures according to some embodiments of the present disclosure.

FIG. 2A-2F show perspective views of a number of example support structures. The support structures may be stamped or etched as part of a strip or array of support structures that are singulated into individual support structures. As shown in FIG. 2A, each example support structure includes a top portion 202 (also referred to as an attachment portion 202) having an outer surface 208 and an inner surface 210. The support structure also includes two or more vertical portions 204 (also referred to as standing members 204) that extend down from the inner surface 210 of the top portion 202. The vertical portions 204 are located at various positions around the outer edge of the top portion 202 to distribute support for the package body (e.g., to support the weight of the package body and distribute any mechanical stress away from external connections). The inner surface 210 has an area large enough to accommodate attachment of a package body with some lateral gap between lateral edges of the package body and the vertical portions 204.

FIG. 2A shows an example support structure that also includes feet or extended lateral portions 206 (also referred to as landing members 206) that extend outward from the vertical portions 204 to form extended bottom surfaces of the vertical portions 204. In the embodiment shown, the vertical portions 204 are located at corners of the top portion 202, but may be placed at different locations on the outer edge of the top portion 202, such as at the mid-points of each edge of the top portion 202. While the embodiment shown in FIG. 2A includes lateral portions 206, another embodiment of the support structure without lateral portions is shown in FIG. 2F.

Figure 2B:
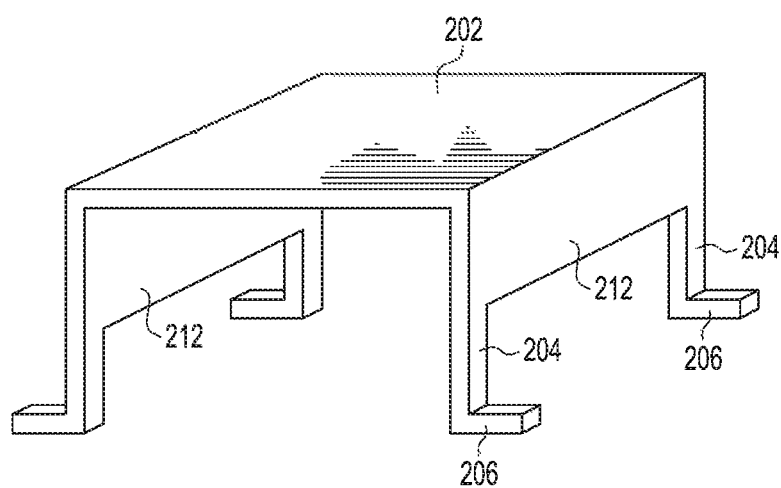

FIG. 2B shows an example support structure that also includes panels 212 between a pair of adjacent vertical portions 204. In some embodiments, the panels 212 may provide an additional surface to attach additional RF absorber material around the package body for additional RF isolation. In some embodiments, the panels 212 may provide additional RF shielding for the package body from any RF signals in the surrounding environment, where the panels 212 may extend down to the PCB 102 and the support structure is a metal or composite metal structure. While only two panels 212 are shown for clarity's sake in FIG. 2B, additional panels 212 may be included to surround the package body in other embodiments. While the embodiment shown in FIG. 2B includes lateral portions 206, another embodiment of the support structure without lateral portions is shown in FIG. 2E, with panels 212 extending down to the PCB 102. Panels may also be added to the embodiment shown in FIG. 2F, where one or more panels may extend down to the dashed perimeter or down to the PCB 102.

Figure 2C:
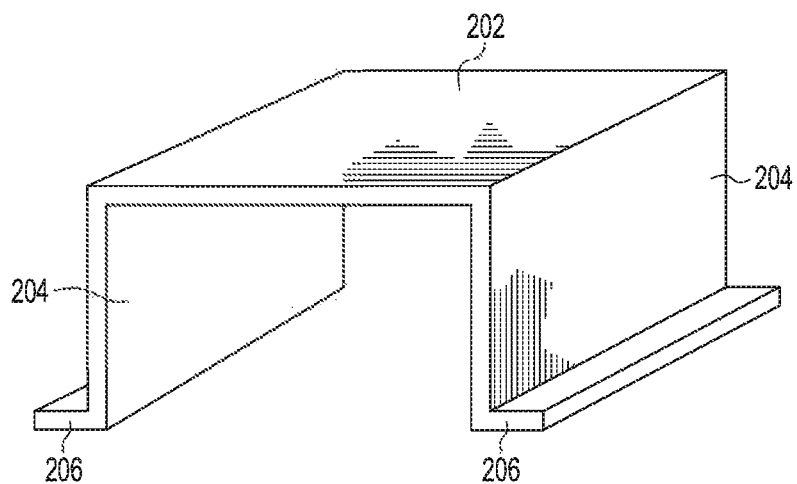
Figure 2D:
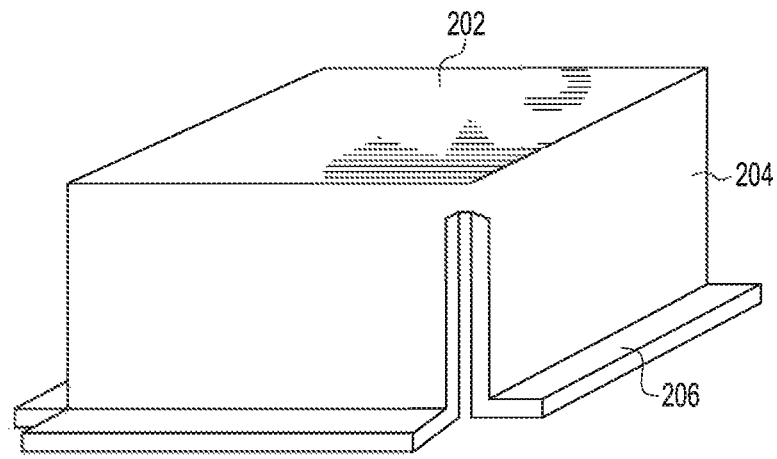
Figure 2E:
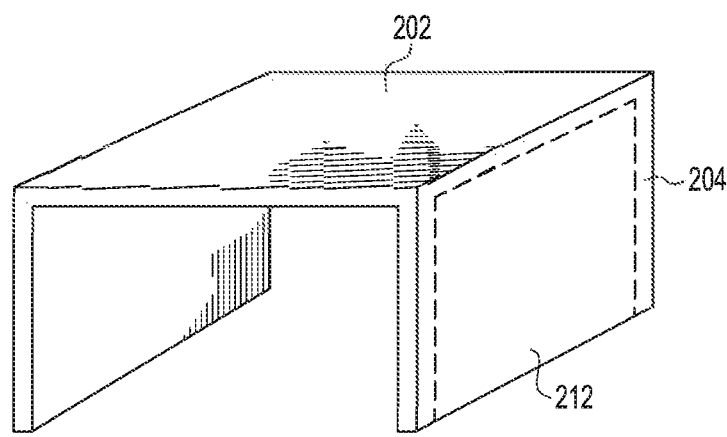
Figure 2F:
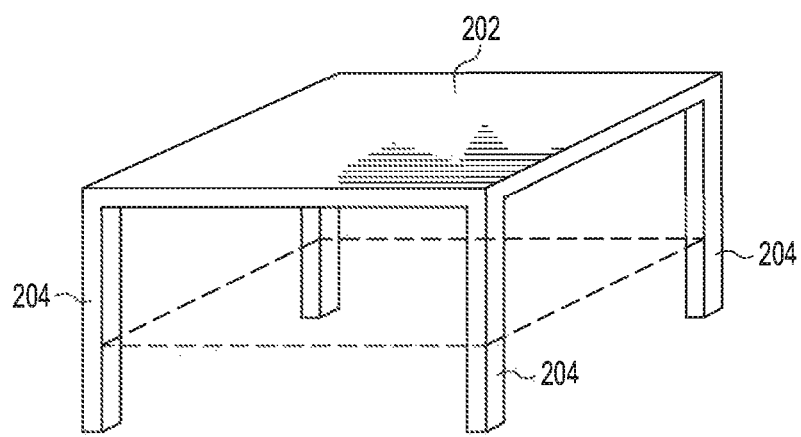

FIG. 2C shows an example support structure that includes two vertical portions 204 that extend down from opposite edges of top portion 202. In the embodiment shown, the vertical portions 204 also have lateral portions 206 that extend for the entire lateral width of the vertical portions 204 for attachment to the PCB 102. The shape of the support structure shown in FIG. 2C may provide ease of fabrication for a strip or array of support structures. In other embodiments, additional vertical portions 204 may extend down from the remaining edges of top portion 202, such as that shown in FIG. 2D.

FIG. 3A-3F illustrates various steps of a wafer level chip scale package (WLCSP) fabrication process for a semiconductor package having one or more isolation structures. The single die 104 shown in FIG. 3A-3F may be representative of a plurality of die formed as part of a single wafer (e.g., shown in FIG. 4A), where the various steps discussed herein are implemented on all die of the wafer. The wafer may then be singulated into a plurality of packages that may be attached to a PCB or other suitable surface, as further discussed below in connection with FIG. 4A-4E.

Figure 3A:
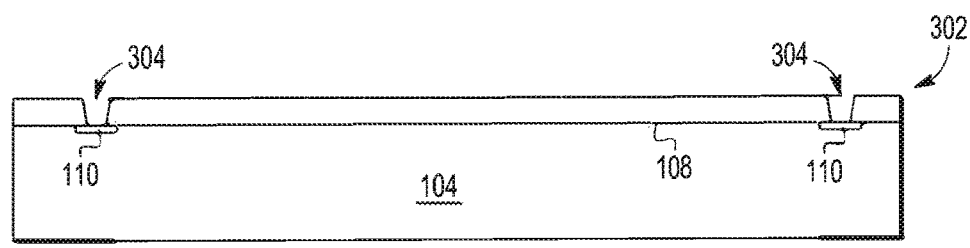
FIGS. 3A, 3B, 3C, 3D, and 3E are block diagrams depicting example steps of a wafer level chip scale package (WLCSP) fabrication process for a semiconductor package having a support structure according to some embodiments of the present disclosure.

FIG. 3A shows a cross-sectional view of an example package being fabricated after a first repassivation layer 302 has been deposited over (e.g., deposited directly on) the active side 108 of die 104 and patterned with a number of openings or vias 304 that are aligned to the bond pads 110 (e.g., the bond pads 110 are respectively exposed within the vias 304). The first repassivation layer 302 is a dielectric or insulating material, examples of which include but are not limited to polyimide, benzocyclobutene (BCB), polybenzoxazole (PBO), or other suitable polymers or dielectric materials. The first repassivation layer 302 may be conformally deposited over the active side 108 in some embodiments, spun-on over the active side 108 in other embodiments, or grown on the active side 108 in yet other embodiments. The first repassivation layer 302 may be patterned using photolithography to expose the bond pads 110 in respective vias 304.

Figure 3B:
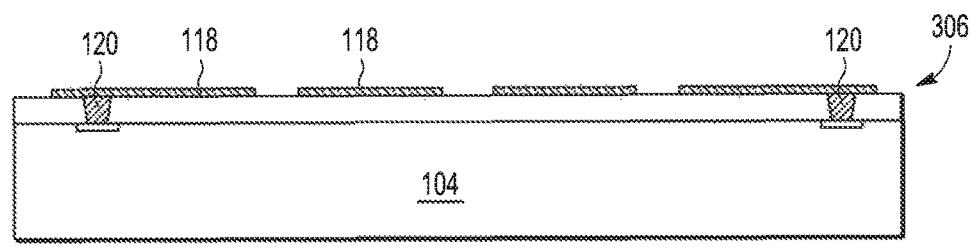

FIG. 3B shows a cross-sectional view after a redistribution layer 306 has been deposited over (e.g., deposited directly on) a top surface of the first repassivation layer 302, including within each via 304, and patterned to form a number of metal traces 118. In the embodiments shown herein, the redistribution layer 306 fills each via 304 to form a metal filled via 120. In other embodiments, the redistribution layer 306 need not fill each via 304 and instead may only coat the sidewalls of each via 304 and the surface of the bond pad 110 within the via 304. Each metal filled via 120 that electrically contacts a bond pad is also connected to a respective metal trace 118. The redistribution layer 306 is an electrically conductive metal, examples of which include nickel, gold, copper, aluminum, or other suitable conductive metal or alloy composed of one or more suitable conductive metals.

Figure 3C:
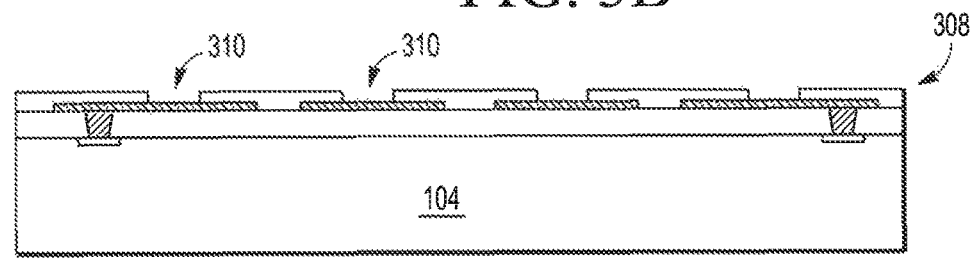

FIG. 3C shows a cross-sectional view after a second repassivation layer 308 has been deposited over (e.g., deposited directly on) the metal traces 118 and any exposed portions of the top surface of the first repassivation layer 302, and patterned with a number of openings or vias 310. The second repassivation layer 308 is also a dielectric or insulating material, which may be the same material as the first repassivation layer 302 in some embodiments. The second repassivation layer 308 may be conformally deposited in some embodiments, spun-on in other embodiments, or grown in yet other embodiments. The second repassivation layer 308 may be patterned using photolithography to expose a top surface of the metal traces 118 within each opening or via 310. The metal traces 118 in the embodiment shown may be referred to as single level metal traces 118 (e.g., formed with a single redistribution layer).

It is noted that the steps shown in FIGS. 3B and 3C may be repeated to form multiple level traces. For example, another redistribution layer may be deposited over the second repassivation layer 308, including within each via 310, and patterned to form extended metal traces 118. Another repassivation layer may then be deposited over the extended metal traces 118, which may be patterned using photolithograph to form openings 310 in an outermost surface 114 of the resulting RDL structure 112.

Figure 3D:
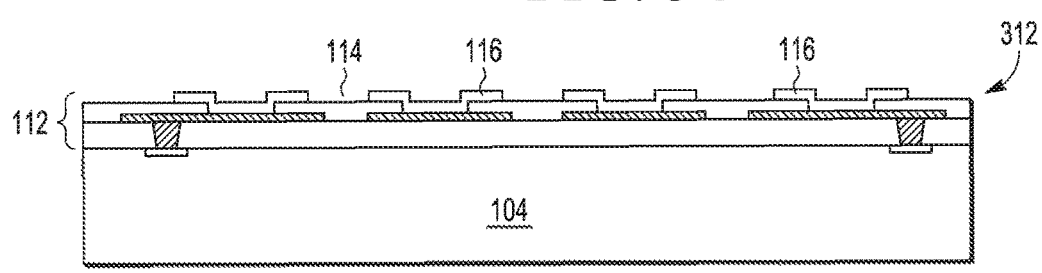

FIG. 3D shows a cross-sectional view after formation of contact pads 116 in the openings 310 in the outermost surface 114 of the resulting RDL structure 112. The contact pads 116 may be formed using under bump metallization (UBM), which is a thin film stack of one or more electrically conductive metals, examples of which include but are not limited to nickel, gold, copper, aluminum, titanium, tungsten, chromium, palladium, or other suitable conductive metal or alloy composed of one or more suitable conductive metals. UBM ensures wettability of the contact pads 116 and proper adhesion of external connections (such as solder) to the contact pads 116.

Figure 3E:
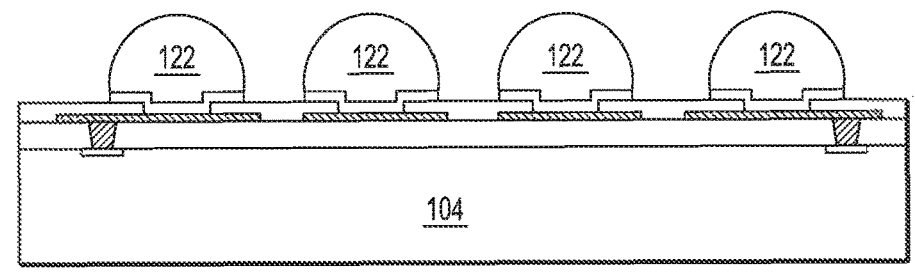

FIG. 3E shows a cross-sectional view after ball drop or other external connection formation process. The external connections 122 are formed on each contact pad 116 with a uniform height. For example, the contact pads 116 may be bumped with solder material that is heated to reflow into solder balls.

Figure 4A:
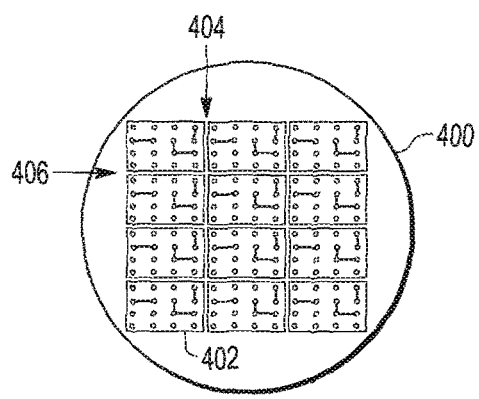
FIGS. 4A, 4B, 4C, 4D, and 4E are block diagrams depicting example steps of a singulation and attachment process for a semiconductor package having a support structure according to some embodiments of the present disclosure.

FIG. 4A shows a top-down view of an example semiconductor wafer 400 after the fabrication process in FIG. 3A-3F has been completed across every die on the wafer 400. The wafer 400 is singulated along saw lanes 404 and 406 to produce a plurality of package 402. A cross-sectional view of an example package 402 after singulation is shown in FIG. 4B.

Figure 4B:
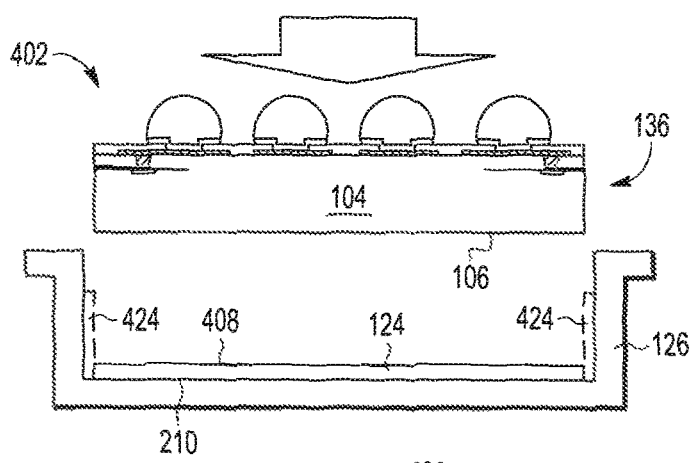

FIG. 4B also shows a cross-sectional view of an example support structure 126 resulting from a support structure fabrication process. This process includes forming the support structure 126, such as by stamping or etching the structure from metal, composite metal, or dielectric material. The support structure may be one of a plurality of support structures formed in a strip or array, which are singulated into individual support structures. The individual support structures may be placed into individual sites on a shipping tray or other temporary carrier with the inner surface 210 of the support structures facing upward. Adhesive material 124 is then placed on each inner surface 210. In some embodiments, adhesive material 124 is a pressure-sensitive adhesive material. In some embodiments, adhesive material 124 includes a layer of RF absorber material with pressure-sensitive adhesive material on both the top and bottom surfaces of the layer of RF absorber material.

A back side of the package body 136 is then pressed into adhesive material 124 on the inner surface 210. The pressure applied to the package body 136 bonds the back side of the package body to the exposed surface 408 of the adhesive material 124, which in turn bonds to the inner surface 210 of the support structure 126. In embodiments where adhesive material 124 includes a layer of RF absorber material, a layer of adhesive material bonds one surface of the RF absorber material to the inner surface 210, and another layer of adhesive material bonds the other surface of the RF absorber material to the back side of the package body 136. Optionally, additional portions of RF absorber material 424 may be attached to panels on the sides of the support structure 126, as indicated by the dashed outline. Such embodiments may need to increase the size of the top portion of the support structure 126 to provide a lateral gap between the RF absorber material 424 and the expected lateral edges of the package body 136 to ensure successful placement of the package body 136.

Figure 4C:
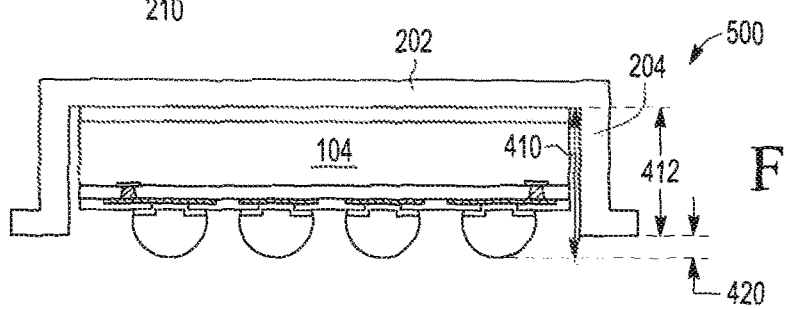
Figure 4D:
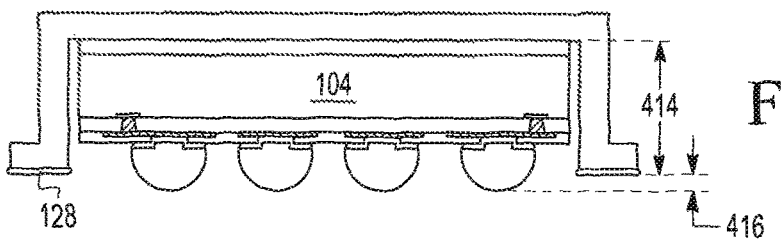

FIG. 4C shows a cross-sectional view of an example package 500 after the package body 136 has been attached to the support structure 126. The height 410 of the package body stack is measured from the inner surface 210 to the peak of the external connections, which includes the heights of the adhesive material 124, the package body 136, the RDL structure 112, and the external connections. The height 412 of the vertical portion of the support structure is measured from the inner surface 210 to the bottom surface of the vertical portion. The height 412 of the vertical portion is less than the height 410 of the package body stack, resulting in a height difference 420. Another embodiment of package 500 is shown in FIG. 4D, where solder attach material 128 is attached to the bottom surface of the vertical portions of the support structure 126. The height 414 of the vertical portion plus the thickness of the solder attach material 128 is still less than the height 410 of the package body stack, resulting in a height difference 416.

Figure 4E:
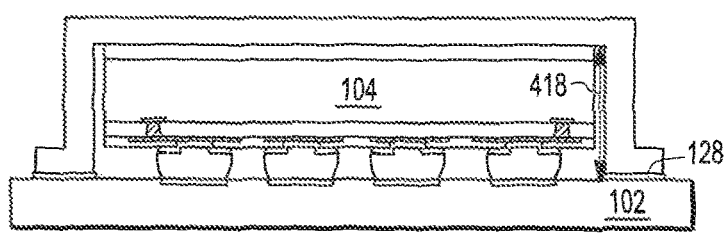

FIG. 4E shows a cross-sectional view after the package 500 has been attached to a PCB 102. Each external connection contacts a respective landing pad on the PCB 102. After reflow, the height of the external connections is reduced, resulting in a reduced height 418 of the package body stack. However, the height difference 420 (such as when attaching the support structure using rivets or similar attachment mechanism) or height difference 416 (such as when attaching the support structure using solder attach material or similar attachment mechanism) takes this height reduction into account. In embodiments where rivets or a similar attachment mechanism are used, height 412 is targeted to the value of the expected height 418. In embodiments where solder attach material or a similar attachment mechanism is used, height 414 is targeted to the value of the expected height 418. In this manner, the support structure 126 should not introduce any mechanical stress to the package due to uneven heights (e.g., vertical portions that are too short or too tall may exert displacement stress on the package, which may pop or otherwise break the external connections), and should distribute any thermos-mechanical stresses away from the external connections.

By now it should be appreciated that there has been provided a support structure to strengthen mechanical attachment of the package to the PCB, which avoids the use of underfill material or edge bond material while achieving robust board level reliability. The support structure may also include a radio frequency (RF) absorber material that is adjacent to the package in order to improve RF signal isolation within the package.

In one embodiment of the present disclosure, a packaged semiconductor device is provided, which includes: a package body including a semiconductor die; a redistribution layer (RDL) structure on an active side of the semiconductor die, the RDL structure including a plurality of contact pads on an outer surface of the RDL structure; a plurality of external connections attached to the plurality of contact pads; and a support structure including an attachment portion and two or more standing members extending from an inner surface of the attachment portion, wherein a back side of the package body is attached to the inner surface of the attachment portion.

One aspect of the above embodiment provides that the packaged semiconductor device further includes: radio frequency (RF) absorber material that attaches the back side of the package body to the inner surface of the attachment portion, the RF absorber material having a first pressure sensitive adhesive layer that attaches to the inner surface of the attachment portion and a second pressure sensitive adhesive layer that attaches to the back side of the package body.

Another aspect of the above embodiment provides that one or more of the plurality of contact pads are connected to radio frequency (RF) signal lines of the semiconductor die.

Another aspect of the above embodiment provides that the packaged semiconductor device further includes: solder attach material on a bottom surface of each of the two or more standing members.

Another aspect of the above embodiment provides that the plurality of external connections is configured to be attached to a plurality of landing pads of a printed circuit board (PCB), and the two or more standing members of the support structure are configured to be attached to the PCB to provide mechanical support for the semiconductor die without underfill material between the semiconductor die and the PCB.

A further aspect of the above embodiment provides that before the packaged semiconductor device is attached to the PCB, a difference between a height measured from the inner surface of the attachment portion to a peak of the external connections and a height of the two or more standing members is less than 50 microns.

Another aspect of the above embodiment provides that the support structure further includes landing members laterally extending from the two or more standing members.

A further aspect of the above embodiment provides that the landing members are configured to be riveted to a printed circuit board (PCB).

Another aspect of the above embodiment provides that the support structure further includes one or more panels between the two or more standing members.

A further aspect of the above embodiment provides that the packaged semiconductor device further includes: radio frequency (RF) absorber material attached to an inner surface of the one or more panels.

Another aspect of the above embodiment provides that the packaged semiconductor device further includes: the support structure is a metal structure.

In another embodiment of the present disclosure, a method for fabricating a packaged semiconductor device is provided, the method including: forming a redistribution layer (RDL) structure on an active side of a semiconductor die, the RDL structure including a plurality of contact pads on an outer surface of the RDL structure; attaching a plurality of external connections to the plurality of contact pads; and attaching the semiconductor die to a support structure includes an attachment portion and two or more standing members extending from an inner surface of the attachment portion, wherein a back side of a package body that includes the semiconductor die is attached to an inner surface of the attachment portion.

One aspect of the above embodiment provides that the attaching the semiconductor die to the support structure includes: utilizing a radio frequency (RF) absorber material to attach the back side of the package body to the inner surface of the attachment portion, wherein the RF absorber material has a first pressure sensitive adhesive layer that attaches to the inner surface of the attachment portion and a second pressure sensitive adhesive layer that attaches to the back side of the package body.

Another aspect of the above embodiment provides that one or more of the plurality of contact pads are connected to radio frequency (RF) signal lines of the semiconductor die.

Another aspect of the above embodiment provides that the method further includes: attaching solder attach material to a bottom surface of each of the two or more standing members.

Another aspect of the above embodiment provides that the plurality of external connections is configured to be attached to a plurality of landing pads of a printed circuit board (PCB), and the two or more standing members of the support structure are configured to be attached to the PCB to provide mechanical support for the semiconductor die without underfill material between the semiconductor die and the PCB.

Another aspect of the above embodiment provides that the support structure further includes landing members laterally extending from the two or more standing members.

A further aspect of the above embodiment provides that the landing members are configured to be riveted to a printed circuit board (PCB).

Another aspect of the above embodiment provides that the support structure further includes one or more panels between the two or more standing members.

A further aspect of the above embodiment provides that the method further includes: attaching radio frequency (RF) absorber material to an inner surface of the one or more panels.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during wafer or package fabrication, which are not significant for the stated purpose or value. As used herein, the term "space" indicates a void or volume in which material is absent. As used herein, the term "laterally" means in a sideways direction or a horizontal direction that is parallel to a major surface of the substrate or package.

Although the invention is described herein with reference to specific embodiments, various modifications and changes can be made without departing from the scope of the present invention as set forth in the claims below. For example, additional or fewer standing members may be implemented in FIG. 2A. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
    a package body comprising a semiconductor die;
    a redistribution layer (RDL) structure on an active side of the semiconductor die, the RDL structure including a plurality of contact pads on an outer surface of the RDL structure;
    a plurality of external connections attached to the plurality of contact pads; and
    a support structure comprising an attachment portion and two or more standing members extending from an inner surface of the attachment portion, wherein a back side of the package body is attached to the inner surface of the attachment portion.

2. The packaged semiconductor device of claim 1, further comprising:
    radio frequency (RF) absorber material that attaches the back side of the package body to the inner surface of the attachment portion, the RF absorber material having a first pressure sensitive adhesive layer that attaches to the inner surface of the attachment portion and a second pressure sensitive adhesive layer that attaches to the back side of the package body.

3. The packaged semiconductor device of claim 1, wherein one or more of the plurality of contact pads are connected to radio frequency (RF) signal lines of the semiconductor die.

4. The packaged semiconductor device of claim 1, further comprising:
    solder attach material on a bottom surface of each of the two or more standing members.

5. The packaged semiconductor device of claim 1, wherein
    the plurality of external connections is configured to be attached to a plurality of landing pads of a printed circuit board (PCB), and
    the two or more standing members of the support structure are configured to be attached to the PCB to provide mechanical support for the semiconductor die without underfill material between the semiconductor die and the PCB.

6. The packaged semiconductor device of claim 5, wherein
    before the packaged semiconductor device is attached to the PCB, a difference between a height measured from the inner surface of the attachment portion to a peak of the external connections and a height of the two or more standing members is less than 50 microns.

7. The packaged semiconductor device of claim 1, wherein
    the support structure further comprises landing members laterally extending from the two or more standing members.

8. The packaged semiconductor device of claim 7, wherein
    the landing members are configured to be riveted to a printed circuit board (PCB).

9. The packaged semiconductor device of claim 1, wherein
    the support structure further comprises one or more panels between the two or more standing members.

10. The packaged semiconductor device of claim 9, further comprising:
    radio frequency (RF) absorber material attached to an inner surface of the one or more panels.

11. The packaged semiconductor device of claim 1, further comprising:
    the support structure is a metal structure.

12. A method for fabricating a packaged semiconductor device, the method comprising:
    forming a redistribution layer (RDL) structure on an active side of a semiconductor die, the RDL structure including a plurality of contact pads on an outer surface of the RDL structure;
    attaching a plurality of external connections to the plurality of contact pads; and
    attaching the semiconductor die to a support structure comprising an attachment portion and two or more standing members extending from an inner surface of the attachment portion, wherein a back side of a package body that includes the semiconductor die is attached to an inner surface of the attachment portion.

13. The method of claim 12, wherein the attaching the semiconductor die to the support structure comprises:
    utilizing a radio frequency (RF) absorber material to attach the back side of the package body to the inner surface of the attachment portion, wherein the RF absorber material has a first pressure sensitive adhesive layer that attaches to the inner surface of the attachment portion and a second pressure sensitive adhesive layer that attaches to the back side of the package body.

14. The method of claim 12, wherein one or more of the plurality of contact pads are connected to radio frequency (RF) signal lines of the semiconductor die.

15. The method of claim 12, further comprising:
attaching solder attach material to a bottom surface of each of the two or more standing members.

16. The method of claim 12, wherein
the plurality of external connections is configured to be attached to a plurality of landing pads of a printed circuit board (PCB), and
the two or more standing members of the support structure are configured to be attached to the PCB to provide mechanical support for the semiconductor die without underfill material between the semiconductor die and the PCB.

17. The method of claim 12, wherein
the support structure further comprises landing members laterally extending from the two or more standing members.

18. The method of claim 17, wherein
the landing members are configured to be riveted to a printed circuit board (PCB).

19. The method of claim 12, wherein
the support structure further comprises one or more panels between the two or more standing members.

20. The method of claim 19, further comprising:
attaching radio frequency (RF) absorber material to an inner surface of the one or more panels.

* * * * *